(12) United States Patent
Bai et al.

(10) Patent No.: US 10,346,663 B2
(45) Date of Patent: Jul. 9, 2019

(54) FINGERPRINT SENSOR AND FINGERPRINT IDENTIFICATION MODULE COMPRISING THE SAME

(71) Applicant: NANCHANG O-FILM BIO-IDENTIFICATION TECHNOLOGY CO., LTD., Nanchang (CN)

(72) Inventors: Anpeng Bai, Nanchang (CN); Bingqian Ma, Nanchang (CN)

(73) Assignee: NANCHANG O-FILM BIO-IDENTIFICATION TECHNOLOGY CO., LTD, Nanchang (CN)

(*) Notice: Subject to any disclaimer, the term of this patent is extended or adjusted under 35 U.S.C. 154(b) by 38 days.

(21) Appl. No.: 15/489,872

(22) Filed: Apr. 18, 2017

(65) Prior Publication Data

US 2018/0068149 A1 Mar. 8, 2018

(30) Foreign Application Priority Data

Sep. 5, 2016 (CN) .......................... 2016 1 0802301
Sep. 5, 2016 (CN) ...................... 2016 2 1037386 U

(51) Int. Cl.
| | |
|---|---|
| *G06K 9/20* | (2006.01) |
| *G06K 9/00* | (2006.01) |
| *H01L 41/113* | (2006.01) |
| *H01L 41/047* | (2006.01) |
| *B06B 1/06* | (2006.01) |
| *H01L 41/312* | (2013.01) |
| *H01L 41/293* | (2013.01) |

(52) U.S. Cl.
CPC .......... *G06K 9/0002* (2013.01); *B06B 1/0622* (2013.01); *H01L 41/0472* (2013.01); *H01L 41/1132* (2013.01); *H01L 41/293* (2013.01); *H01L 41/312* (2013.01); *G06K 9/00053* (2013.01)

(58) Field of Classification Search
CPC ..................................................... G06K 9/0002
See application file for complete search history.

(56) References Cited

U.S. PATENT DOCUMENTS

| | | | | |
|---|---|---|---|---|
| 4,800,461 A | * | 1/1989 | Dixon .................. | H05K 3/4691 156/253 |
| 7,514,842 B2 | * | 4/2009 | Scott .................... | G06K 9/0002 310/316.01 |
| 9,613,246 B1 | * | 4/2017 | Gozzini ............... | G06K 9/0002 |

(Continued)

*Primary Examiner* — Brian Werner
(74) *Attorney, Agent, or Firm* — Hodgson Russ LLP

(57) ABSTRACT

The present disclosure discloses a fingerprint sensor and a fingerprint identification module. The fingerprint sensor comprises a substrate and an ultrasonic transducer. The upper surface of the substrate is provided with a plurality of first connecting electrodes, wherein the lower surface of the substrate is provided with a plurality of second connecting electrodes, and wherein the first connecting electrodes are configured to electrically connect with the second electrodes. The ultrasonic transducer is provided on the upper surface, wherein the ultrasonic transducer comprises a plurality of third connecting electrodes, and wherein the third connecting electrodes are configured to electrically connect with the first connecting electrodes.

18 Claims, 13 Drawing Sheets

(56) References Cited

U.S. PATENT DOCUMENTS

| | | | |
|---|---|---|---|
| 2003/0102777 A1* | 6/2003 | Kuniyasu | B06B 1/0629 |
| | | | 310/334 |
| 2014/0219521 A1* | 8/2014 | Schmitt | G06K 9/0002 |
| | | | 382/124 |
| 2017/0364726 A1* | 12/2017 | Buchan | G06K 9/0002 |

* cited by examiner

FINGERPRINT SENSOR AND FINGERPRINT IDENTIFICATION MODULE COMPRISING THE SAME

CROSS-REFERENCE TO RELATED APPLICATION

This application claims priority to and the benefit of Chinese Patent Application Nos. 201610802301.5 and 201621037386.4, both filed with the State Intellectual Property Office of P. R. China on Sep. 5, 2016. The entire contents of the above-identified applications are incorporated herein by reference.

FIELD

Embodiments of the present disclosure relate to sensor technology, and more particularly to a fingerprint sensor and a fingerprint identification module.

BACKGROUND

In the related art, short circuit may be happened to connecting electrodes when the ultrasonic transducer is bonded to a flexible circuit board due to different thermal expansion in the process of bonding. As a pixel density increasing with technology development, a density of the connecting electrodes correspondingly increases, and pitches between the connecting electrodes become such small that short circuit may happen to the connecting electrodes when the ultrasonic transducer is bonded to the circuit board, degrade quality of the ultrasonic fingerprint sensor.

SUMMARY

Embodiments of the present disclosure seek to solve at least one of the problems existing in the prior art to at least some extent.

Embodiments of a broad aspect of the present disclosure provide a fingerprint sensor. The fingerprint sensor, according to embodiments of the present disclosure comprises: a substrate comprising an upper surface, a plurality of first connecting electrodes formed on the upper surface, a lower surface, and a plurality of second connecting electrodes formed on the lower surface, and wherein the first connecting electrodes are configured to electrically connect with the second electrodes; and an ultrasonic transducer, wherein the ultrasonic transducer is provided on the upper surface, wherein the ultrasonic transducer comprises a plurality of third connecting electrodes, and wherein the third connecting electrodes are configured to electrically connect with the first connecting electrodes.

In some embodiments of the present disclosure, the first connecting electrodes are arranged corresponding to the third connecting electrodes.

In some embodiments of the present disclosure, the positive projections of second connecting electrodes on the upper surface of the substrate are distributed around the first connecting electrodes.

In some embodiments of the present disclosure, the ultrasonic transducer comprises: a piezoelectric layer, wherein the piezoelectric layer comprises an array of piezoelectric pillars; a plurality of receiving electrode lines being formed on the piezoelectric layer, each of the receiving electrode lines is configured to connect to a corresponding column of the piezoelectric pillars and one end of a receiving electrode line functions as one of the third connecting electrodes; a plurality of emitting electrode lines being formed beneath the piezoelectric layer, each of the emitting electrode lines is configured to connected to a corresponding row of the piezoelectric pillars and one end of the a emitting electrode line functions as one of the third connecting electrodes.

In some embodiments of the present disclosure, the fingerprint sensor further comprises bonding wires, wherein the bonding wires are configured to pass through the substrate to connect the first connecting electrodes with the second connecting electrodes.

In some embodiments of the present disclosure, the fingerprint sensor further comprises: a reinforcing board is provided on the lower surface of the substrate.

In some embodiments of the present disclosure, the reinforcing board is provided avoiding to cover the seconding connecting electrodes.

In some embodiments of the present disclosure, the substrate comprises a rigid-flexible circuit board, wherein the rigid-flexible circuit board comprises a rigid portion and a flexible portion connected with the rigid portion, wherein the ultrasonic transducer is provided on the rigid portion.

In some embodiments of the present disclosure, the second connecting electrodes are provided on the lower surface of the flexible portion.

Embodiments of another broad aspect of the present disclosure provide a fingerprint identification module. The fingerprint identification module comprises the above-identified fingerprint sensor for a fingerprint identification module.

With the fingerprint sensor and the fingerprint identification module according to embodiments of the present disclosure, the third connecting electrodes of the ultrasonic transducer are being connected to the second connecting electrodes via the first connecting electrodes of the substrate, so that the distribution pitch of the connecting electrodes of the ultrasonic transducer is enlarged. The second connecting electrodes are easier to be bonded to the contacts of the flexible circuit board of the control chip accurately, and the manufacturing for the fingerprint sensor with small spacing of the connecting electrodes and high resolution may be accomplished.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
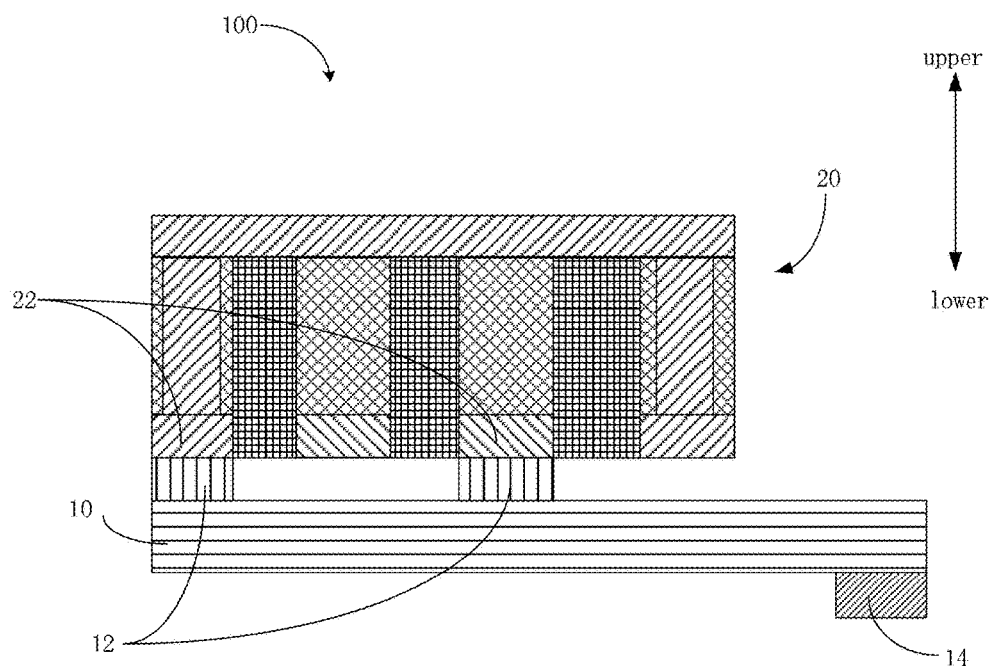
FIG. 1 is a schematic cross section view of an exemplary fingerprint sensor according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it should be understood that the terms such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation as then described or as shown in the drawings. These terms are merely for convenience and concision of description and do not alone indicate or imply that the device or element referred to must have a particular orientation. Thus, it cannot be understood to limit the present disclosure.

In addition, terms such as "first" and "second" are used herein for purposes of description and are not intended to indicate or imply relative importance or significance or impliedly indicate quantity of the technical feature referred to. Thus, the feature formed with "first" and "second" may comprise one or more of these features. In the description of the present disclosure, "a plurality of" means two or more than two of these features, unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which could be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

A fingerprint sensor and a fingerprint identification module, according to embodiments of the present disclosure, may be described below with reference to FIGS. 1-15.

In some embodiments, as shown in FIG. 1, the fingerprint sensor 100 comprises a substrate 10 and an ultrasonic transducer 20. Wherein a plurality of first connecting electrodes 12 are provided on the upper surface of the substrate 10, a plurality of second electrodes 14 are provided on the lower surface which is on the opposite to the upper surface. The first connecting electrodes 12 are configured to electrically connect with the second electrodes 14. The ultrasonic transducer 20 is provided on the upper surface of the substrate 10. The ultrasonic transducer 20 comprises a plurality of third connecting electrodes 22, wherein the third connecting electrodes 22 are being configured to electrically connect with the first connecting electrodes 12.

In an embodiment of the present disclosure, a manufacturing method of a fingerprint sensor comprises:

providing a substrate, wherein the substrate comprises the first connecting electrodes and the second connecting electrodes;

bonding the ultrasonic transducer to the upper surface of the substrate.

Figure 2:
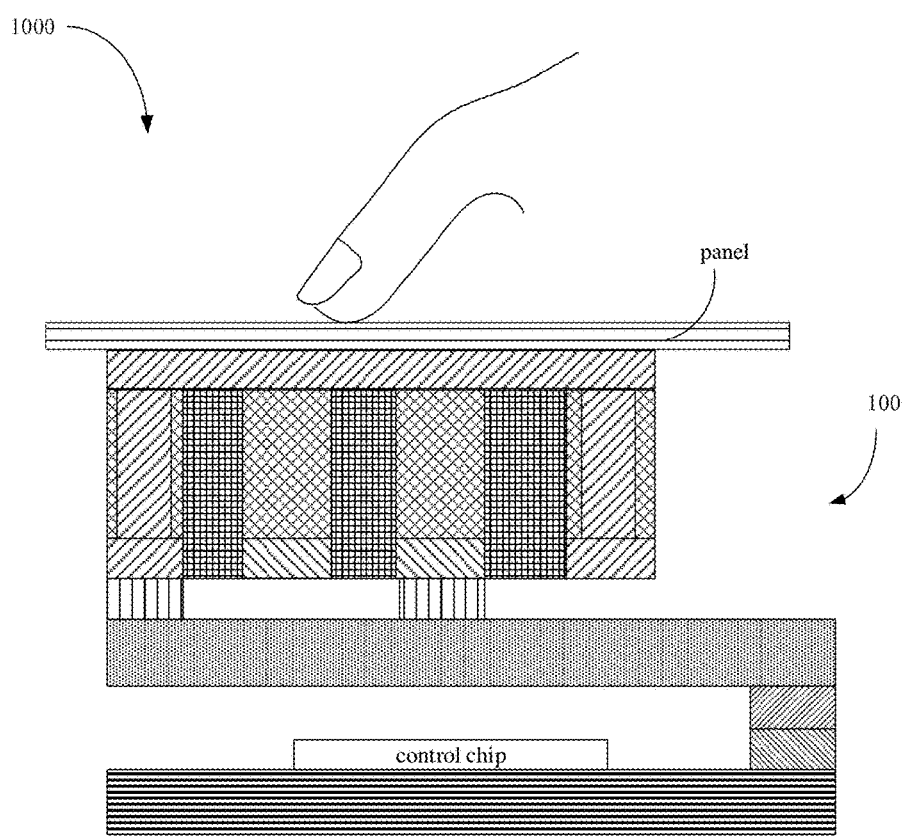
FIG. 2 is a schematic view of an exemplary fingerprint identification module according to an embodiment of the present disclosure.

As shown in FIG. 2, The manufacturing method of the embodiment of the present disclosure could be used for manufacturing the fingerprint sensor 100 according to the embodiment of the present disclosure. The fingerprint sensor 100 could be applied on the fingerprint identification module 1000.

In the packaging process of the fingerprint sensor 100, the ultrasonic transducer 20 is directly bonded to the contacts of the flexible circuit board of the control chip via the third connecting electrodes 22 through anisotropic conductive films (ACF). And in the heating process, the third connecting electrodes 22 and the flexible circuit board are thermally expanded, when the pitches between the third connecting electrodes 22 become such small that short circuit may happen to the third connecting electrodes 22 when the ultrasonic transducer 20 is bonded to the flexible circuit board due to different thermal expansion.

With the fingerprint sensor 100 and the fingerprint identification module 1000 according to embodiments of the present disclosure, the third connecting electrodes 22 of the ultrasonic transducer 20 are being connected to the second connecting electrodes 14 via the first connecting electrodes 12 of the substrate 10, so that the distribution of pitches of the connecting electrodes of the ultrasonic transducer 20 is enlarged. The second connecting electrodes 14 are easier to be bonded to the contacts of the flexible circuit board of the control chip accurately, and the manufacturing for the fingerprint sensor 100 with small spacing of the connecting electrodes and high resolution may be accomplished.

Figure 3:
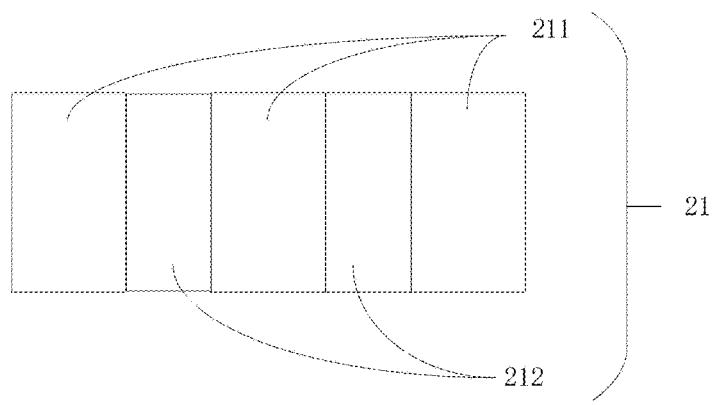
FIG. 3 is a schematic side view of an exemplary piezoelectric layer according to an embodiment of the present disclosure.
Figure 4:
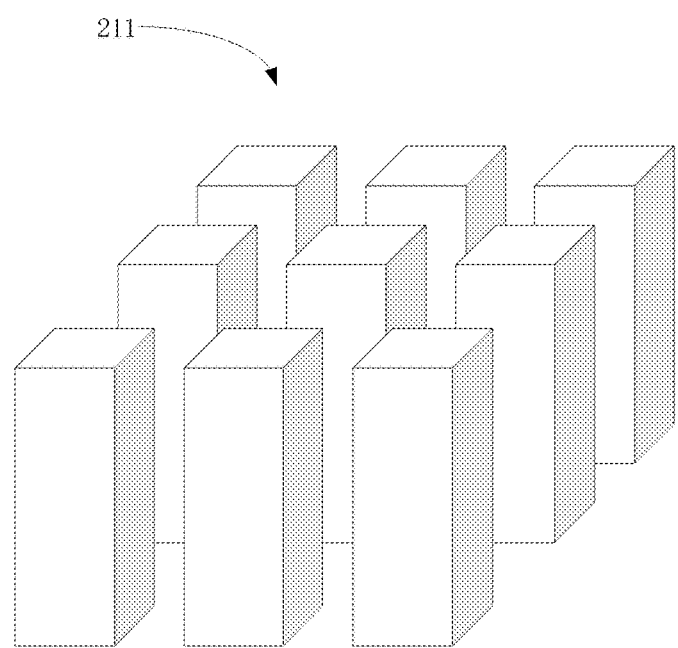
FIG. 4 is a schematic stereoscopic view of an exemplary piezoelectric pillars according to an embodiment of the present disclosure.
Figure 5:
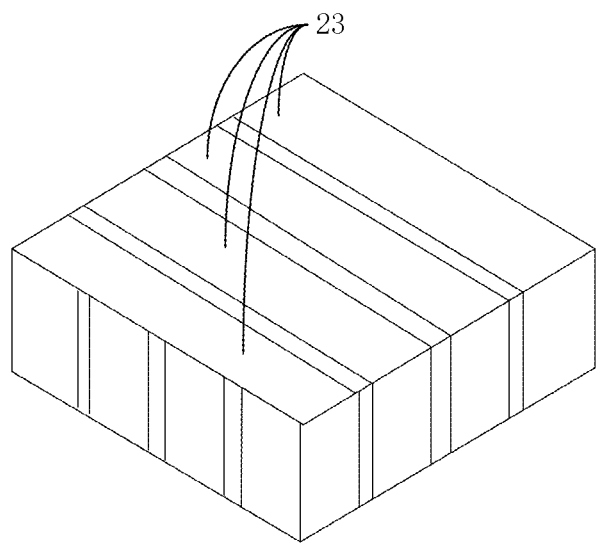
FIG. 5 is a schematic view of an exemplary emitting electrode lines and receiving electrode lines according to an embodiment of the present disclosure.
Figure 5:
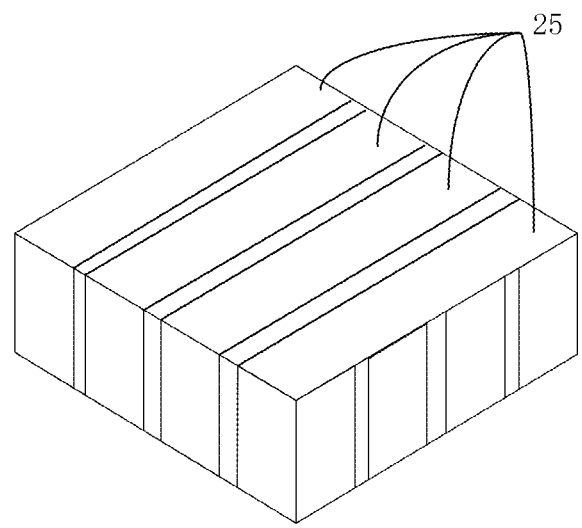

In detail, as shown in FIGS. 3-5, in some embodiments of the present disclosure, the ultrasonic transducer 20 comprises a piezoelectric layer 10, a plurality of receiving electrode lines 23 and a plurality of emitting electrode lines 25. Wherein the piezoelectric layer 21 comprises an array of piezoelectric pillars 211. The plurality of receiving electrode lines 23 are being formed on the piezoelectric layer 21 and each of the receiving electrode lines 23 is configured to connect to a corresponding column of the piezoelectric pillars 211. One end of a receiving electrode line 23 is configured to define a third connecting electrode 22. The plurality of emitting electrode lines 25 are being formed beneath the piezoelectric layer 21 and each of the emitting electrode lines 25 is configured to connect to a corresponding row of the piezoelectric pillars 211. One end of an emitting electrode line 25 is configured to define a third connecting electrode 22.

In detail, the manufacturing method of the ultrasonic transducer 20 comprises:

forming a piezoelectric layer, wherein the piezoelectric comprises an array of piezoelectric pillars;

forming a plurality of receiving electrode lines on the piezoelectric layer, each of the receiving electrode lines is configured to connect to a corresponding column of the piezoelectric pillars, and one end of a receiving electrode line is configured to define a third connecting electrode;

forming a plurality of emitting electrode lines beneath the piezoelectric layer, each of the emitting electrode lines being configured to connected to a corresponding row of the piezoelectric pillars and one of an emitting electrode line is configured to define a third connecting electrode.

The manufacturing process and the structure will be described below in detail with a single transducer 100 as an example.

In detail, in some embodiments, the piezoelectric layer 21 further comprises fillers 212.

Wherein the fillers 14 are configured to fill the gaps defined between the plurality of piezoelectric pillars 212.

Figure 6:
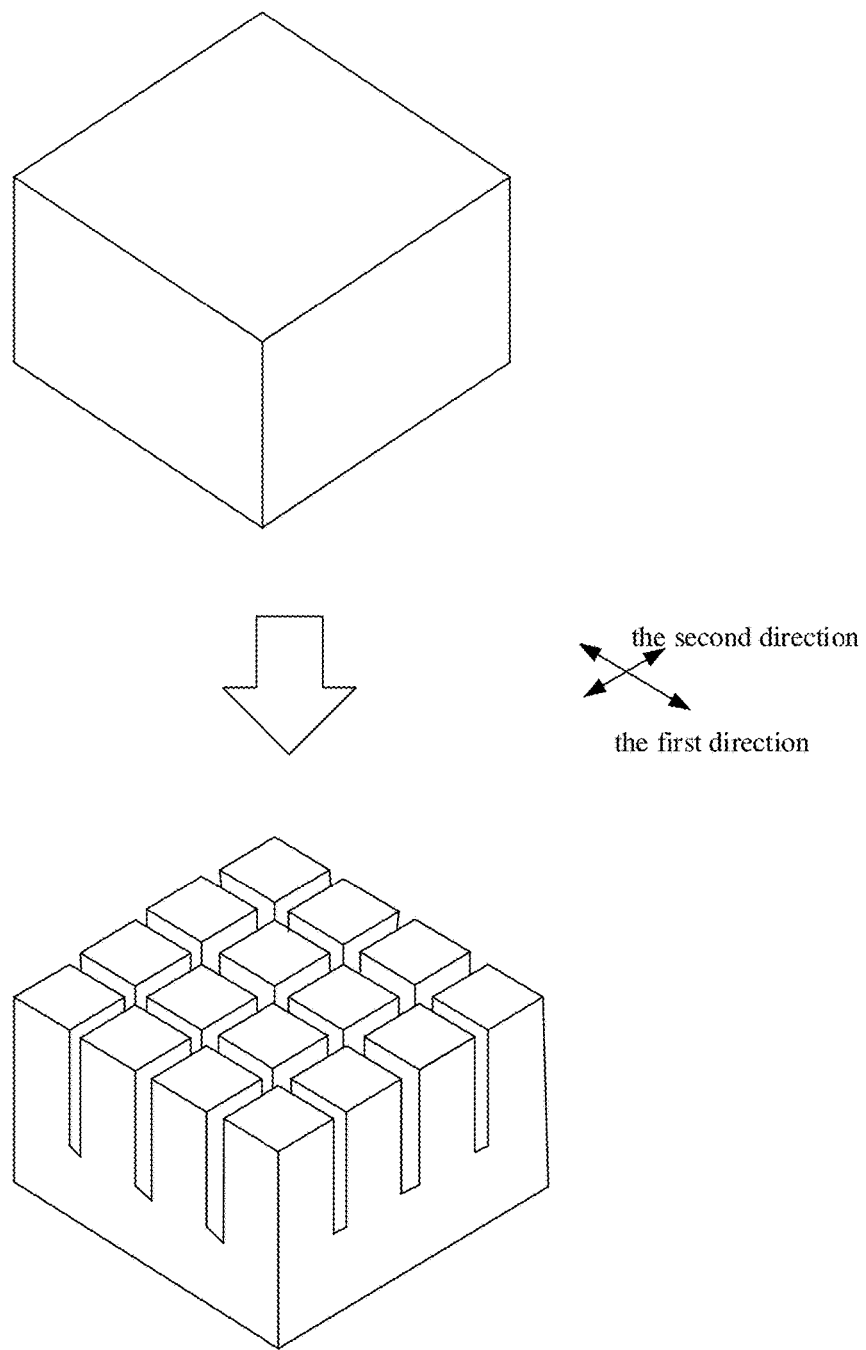
FIG. 6 is a schematic view of an exemplary manufacturing process of piezoelectric layer according to an embodiment of the present disclosure.

As shown in FIG. 6, in some embodiments of present disclosure, the piezoelectric layer 21 may be made of piezoelectric material, such as piezoelectric ceramics. The piezoelectric pillars 211 may be formed through cutting a block of piezoelectric material. In detail, the piezoelectric material may be cut in a first direction by using a cutting device with a certain thickness and the cutting operation is repeated until the cutting in the first direction is completed according to the design requirements of the piezoelectric pillars 211.

In detail, the thickness of the cutting device is the gap between the formed piezoelectric pillars 211, and the depth of the cutting is the height of the piezoelectric pillars 211. The appropriate dimensions of the gap and the height can generally be selected according to the design requirements of the ultrasonic transducer 20.

Preferably, in some embodiments, the dimension of gap may be 50 microns to meet the requirements of the sampling resolution of the ultrasonic transducer 20, such as the resolution is greater than 508 DPI (Dots per Inch). When the dimension of the gap is larger than 50 microns, the sampling resolution will be reduced, the transmitted and the received signal will become weak, and thus cannot identify the fingerprint accurately.

It should be noted that, the piezoelectric material should be thicker than the piezoelectric pillars 211 to facilitate the process of manufacturing. In other words, cutting the material according to the size requirement of the piezoelectric pillars 12, and bottom of the material should be keep continuous.

A second direction cutting which is different from the first direction is necessary in order to form piezoelectric pillars 211 arranged in an array after the first direction cutting, the second direction may be perpendicular to the first direction as an example. Similarly, to the first direction cutting, the second direction cutting should meet the design requirements and the inter-pillar gap of the piezoelectric pillars 211. After the second direction cutting, the piezoelectric material comprises an upper portion which comprises a plurality of piezoelectric pillars 12 formed by cutting, and a continuous lower portion.

Such that, a plurality of piezoelectric pillars 12 could be cut according to the design requirements.

In detail, in some embodiments of the present disclosure, each of the piezoelectric pillars 12 has a rectangular cross-section with a width of 30 microns and a height of 70-80 microns.

Such that, the piezoelectric pillars 12 can meet the requirements of the ultrasonic transducer 20 for a high sampling resolution, such as higher than 508 DPI. Certainly, the dimensions of the piezoelectric pillars 211 will be different in different designs.

Further, the continuous lower portion of the piezoelectric material after the two directions cutting is surplus and needs to be removed. If the removing operation is continued on the material, the piezoelectric pillars 211 will be dispersed and the piezoelectric layer 21 cannot be formed. Therefore, the gap between the piezoelectric pillars 211 formed after the two directions should be filled with the fillers 212 before the following cutting operation.

Such that, the plurality of the piezoelectric pillars 211 may be viscously connected, and the surplus of the material may be removed to form the piezoelectric layer 21.

In some embodiments of the present disclosure, the fillers 212 may be epoxy glues, such as epoxy resin glues. The epoxy resin glues are an insulation material, which has a good temperature resistance, a good solubility, and a strong bonding ability and also has a bright surface after curing.

Such that, the plurality of the piezoelectric pillars 211 could be bonding well by the epoxy glues, so that the piezoelectric layer 21 is formed as a good mechanical property.

In addition, the fillers 212 may be other materials with non-conductive and non-piezoelectric with same, and it is not limited.

Further, after the piezoelectric layer 21 is formed, the manufacturing process of the electrode lines will be operated on the upper surface and the lower surface of the piezoelectric layer 21.

In detail, in some embodiments, the upper and lower electrode lines may be formed by the sputtering process.

The sputtering process uses electrons or high-energy lasers to bombard the target and spit the surface components of the target in atomic or ionic form and eventually precipitate on a substrate surface, undergoes a film formation process, and finally form a film Preferably, in some embodiments, selecting silver as the target, the receiving electrode lines 23 being formed on the piezoelectric layer 21 and the emitting electrode lines 25 being formed beneath the piezoelectric layer 10 by the sputtering process.

In detail, in some embodiments, the thickness of the receiving electrode lines 23 and the emitting electrode lines 25 are both 2.5 microns.

Such that, it can make the thickness of the receiving electrode lines 23 and the emitting electrode lines 25 meets the process requirements to ensure a good electrical property of lines.

In detail, when the piezoelectric pillars 211 are arranged in a matrix of m*n, one receiving electrode line 23 is formed on the upper surface of each column of the piezoelectric pillars 211, in other words, n receiving electrode lines 23 will be formed on the piezoelectric layer 21. And one emitting electrode line 25 is formed on the lower surface of each row of the piezoelectric pillars 211, in other words, m emitting electrode lines 25 will be formed beneath the piezoelectric layer 21.

It should be noted that, the receiving electrode lines 23 and the emitting electrode lines 25 should be intersected, in other words, the receiving electrode line 23 and the emitting electrode lines 25 cannot be arranged in parallel, for example, they may be arranged vertically.

Such that, the receiving electrode lines 23 and the emitting electrode lines 25 intersect each other and could be configured to transmit and receive signals when an object approaches or contacts with the piezoelectric layer 10.

In detail, the receiving electrode lines 23 and the emitting electrode lines 25 are configured to receive and transmit ultrasonic signals. When a finger is close to or in contact with the piezoelectric layer 21, the piezoelectric material is deformed. And ultrasonic signal will be generated when the frequency of the deformation is greater than the acoustic, such as 10-20 MHz. The ultrasonic signal is transmitted by the emitting electrode lines 25 in the direction of the finger, and the ultrasonic signal reflected by the finger will be received by the receiving electrode lines 23. Furthermore, the fingerprint identification module 1000 can identify the fingerprint according to the difference between the transmitted and received signals.

In more detail, when a voltage with a resonant frequency in the ultrasonic frequency band is externally applied to the emitting electrode lines 25 and the receiving electrode lines 23 formed on the opposite sides of the piezoelectric layer 10, the ultrasonic signal will be generated by the piezoelectric layer 21.

With respect to the ultrasonic signal, when the finger does not come into contact with or approach to the piezoelectric layer 21, most of the ultrasonic signal transmitted from the emitting electrode lines will return to the receiving electrode lines 23 rather than pass through the interface between the piezoelectric layer 21 and the air due to the difference in acoustic impedance between the air and the piezoelectric layer 21.

In the meantime, when the finger approaches or contacts the piezoelectric layer 21, a portion of the ultrasound signal transmitted from the emitting electrode lines passes through the interface between the skin of finger and the piezoelectric layer 21 into the finger. As a result, the intensity of the reflected and returned signal is reduced, so that a fingerprint pattern could be detected.

Although it is difficult to identify a fingerprint pattern with the naked eye for a user, the fingerprint may have a plurality of patterns with repeated ridge lines and valley lines. When the ridge lines and the valley lines are repeated, the height between the ridge lines and the valley lines will change. Thus, the piezoelectric layer 21 does not come into direct contact with the skin at the valley lines of the fingerprint, but could be in direct contact with the skin at the ridge lines of the fingerprint.

Therefore, the ultrasonic signal transmitted from the emitting electrode lines 25 of the piezoelectric layer 21 corresponding to the valley lines of the fingerprint is transmitted to the outside, and most of the ultrasound signal is reflected toward the inside and received by the receiving electrode lines 23. While, the ultrasonic signal transmitted from the emitting electrode lines 25 of the piezoelectric layer 21 corresponding to the ridge lines of the fingerprint passes through the boundary of the finger and is reflected so that the intensity of the ultrasonic signal received by the receiving electrode lines 23 is remarkably reduced.

Such that, the fingerprint pattern could be detected by measuring the intensity or the reflection coefficient of the ultrasonic signal according to the valley lines and the ridge lines on the piezoelectric layer 21. The reflection and reception of the ultrasonic signal is due to the difference in acoustic impedance.

Figure 7:
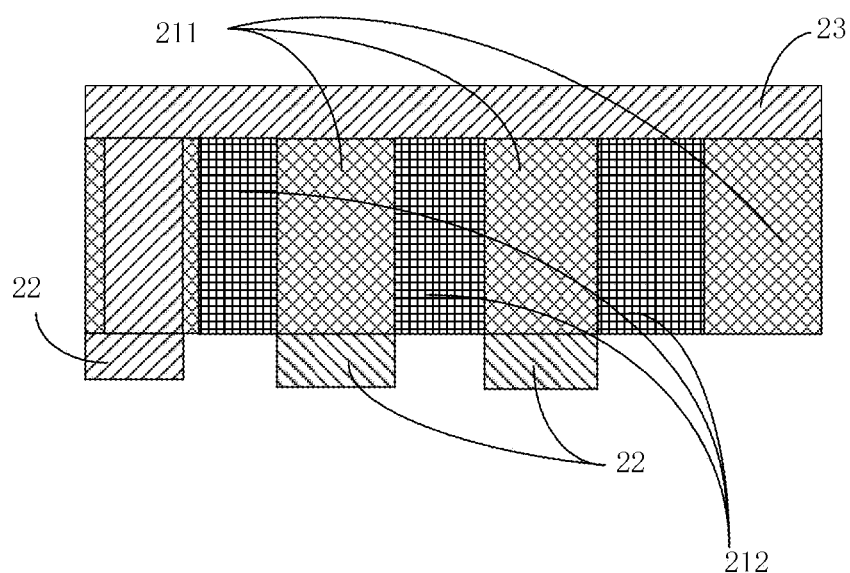
FIG. 7 is a schematic view of an exemplary structure of the third connecting electrodes according to an embodiment of the present disclosure.

As shown in FIG. 7, further, for the following packing process, the receiving electrode lines 23 on the piezoelectric layer 21 should be guided beneath the piezoelectric layer 21. In some embodiments, the manufacturing method further comprises:

forming perforations from top to bottom at the piezoelectric pillars connected to one end of the receiving electrode lines to guide the receiving electrode lines to pass through the piezoelectric pillars and to define the third connecting electrodes.

In the specific manufacturing process, the perforations may be formed at a predetermined position on the uncut piezoelectric material according to the design requirements, which is easier to operate compared to form the perforations after the completion of the cutting of the piezoelectric pillars 211. The perforations may also be formed after cutting the piezoelectric pillars 211, and this is not limited thereto.

It should be noted that, each receiving electrode line 23 is only need to expose from one side of the piezoelectric pillars, in other words, only one end of each receiving electrode line 23 is selected as a contact. The piezoelectric pillars 211 which are being formed perforations may be selected according to the positions of contacts actually designed in the process of forming the perforations. For example, the piezoelectric pillars 211 on the opposite sides of the matrix could be selected to be configured to form the perforations. In another example, the perforations could be on the same side of the matrix.

In detail, the perforations are being formed by the electroplating silver process, so that the receiving electrode lines 23 on the piezoelectric layer 21 could be guided to the lower surface of the piezoelectric layer 21 through the perforations, and the third connecting electrodes 22 are being formed beneath the piezoelectric pillars 211.

It should be noted that, emitting electrode lines 25 are not be provided beneath the one or two rows of the piezoelectric pillars which are forming the perforations to prevent the short circuit due to the connection of lines.

Figure 8:
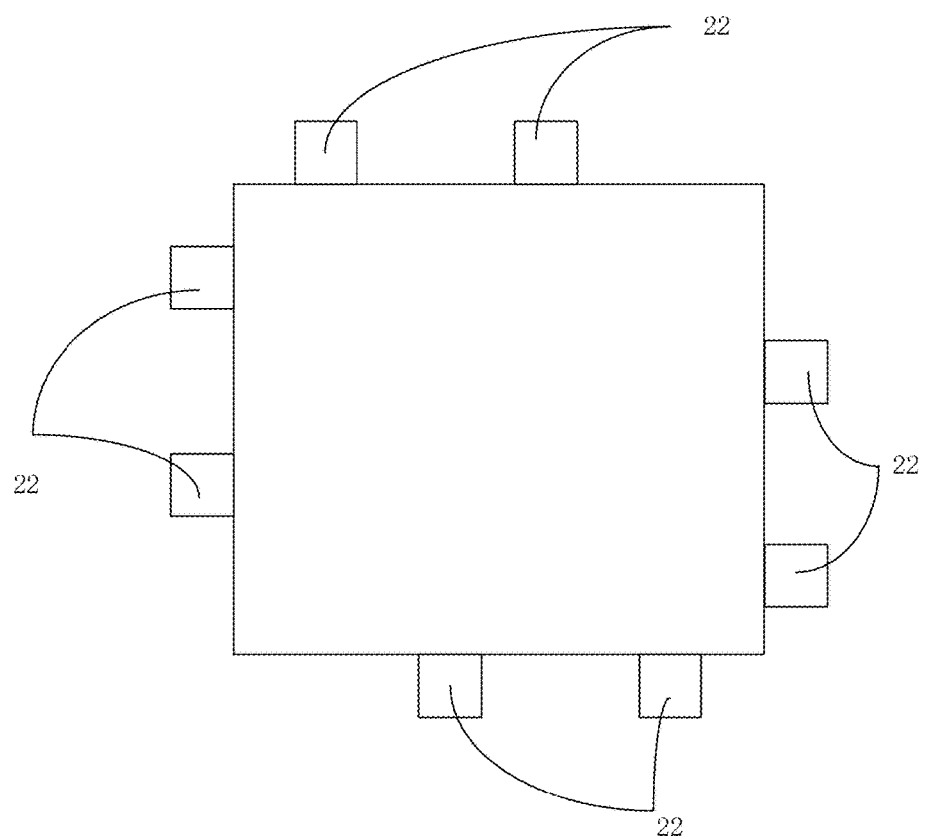
FIG. 8 is a schematic view of an exemplary arrangement of the third connecting electrodes according to an embodiment of the present disclosure.

As shown in FIG. 8, the emitting electrode lines 25 beneath the piezoelectric layer 10 also need to form the third connecting electrodes 22.

In detail, in some embodiments of the present disclosure, the manufacturing method further comprises:

forming the third connecting electrodes at the piezoelectric pillars connected with one end of the emitting electrode lines.

Similarly, each emitting electrode line 25 is only need to expose from one side of the piezoelectric pillars, so that either end of the emitting electrode lines 25 could be selected to form the third connecting electrodes 22.

Figure 9:
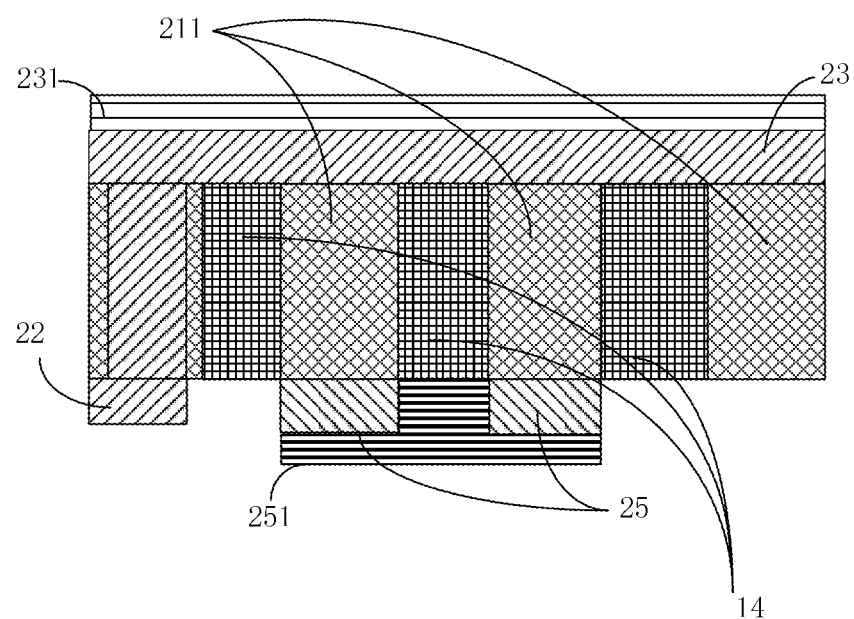
FIG. 9 is a schematic view of an exemplary structures of the upper protective layer and the lower protective layer according to an embodiment of the present disclosure.

As shown in FIG. 9, furthermore, in some embodiments of the present disclosure, the manufacturing method further comprises: forming an upper protective layer being covered the receiving electrode lines; and forming a lower protective layer being covered the emitting electrode lines in order to protect the receiving electrode lines and the emitting electrode lines which are exposed.

In some embodiments of the present disclosure, the ultrasonic transducer 20 further comprises an upper protective layer 231 and a lower protective layer 251. The upper protective layer 231 is configure to cover the receiving electrode lines 23, and the lower protective layer 251 is configure to cover the emitting electrode lines 25.

Such that, the protective layers are configured to protect the lines, further to ensure the electrical performance of the ultrasonic transducer 20.

Preferably, the upper protective layer 231 and the lower protective layer 251 may be made of SU8 material, so as to achieve the effect of insulation and to protect the lines.

It should be noted that, in the following packaging process, the ultrasonic transducer 20 is configured to electrically connect to the corresponding contacts on the circuit, so that the protective layer should be provided to avoid the third connecting electrodes 22.

In industrial production, a plurality of the ultrasonic transducer 20 are produced at the same time, such as 1000-2000. The plurality of the ultrasonic transducer 20 may be manufactured on the piezoelectric material at the same time, so as to form an ultrasonic transducer array. And a single ultrasonic transducer 20 is formed by cutting the ultrasonic transducer array.

Detailed manufacturing steps refer to the description of the manufacturing method and the structure of the single ultrasonic transducer 20 as described above. The detailed description will be omitted here. In general, a bulk piezoelectric material may be selected and made into a circular piezoelectric wafer having a radial dimension of 8 inches or 12 inches.

Further, a substrate is being manufactured under the ultrasonic transducer 20.

It could be understood that, the substrate 10 may be a partially rigid board, and certainly, it also could be an entire rigid board in order to overcome the difficulty of connecting third connecting electrodes with the flexible circuit board, and the specific type of the board may be determined depending on the installation pitches of the package of the fingerprint identification module 1000.

Figure 10:
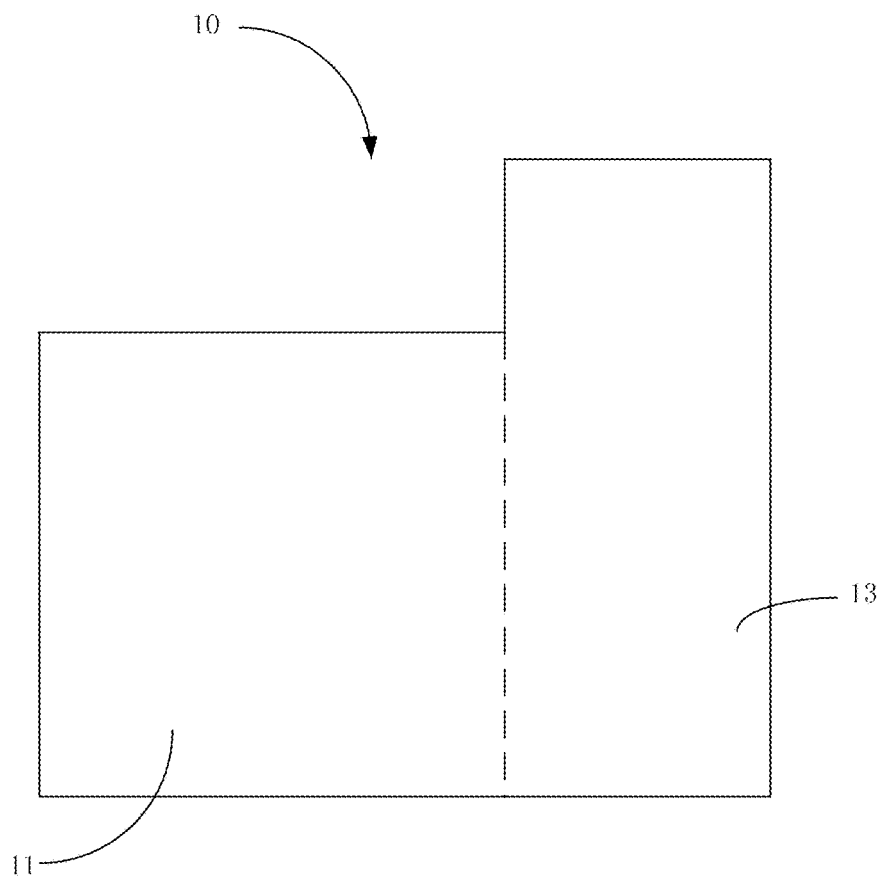
FIG. 10 is a schematic view of an exemplary substrate according to an embodiment of the present disclosure.
Figure 11:
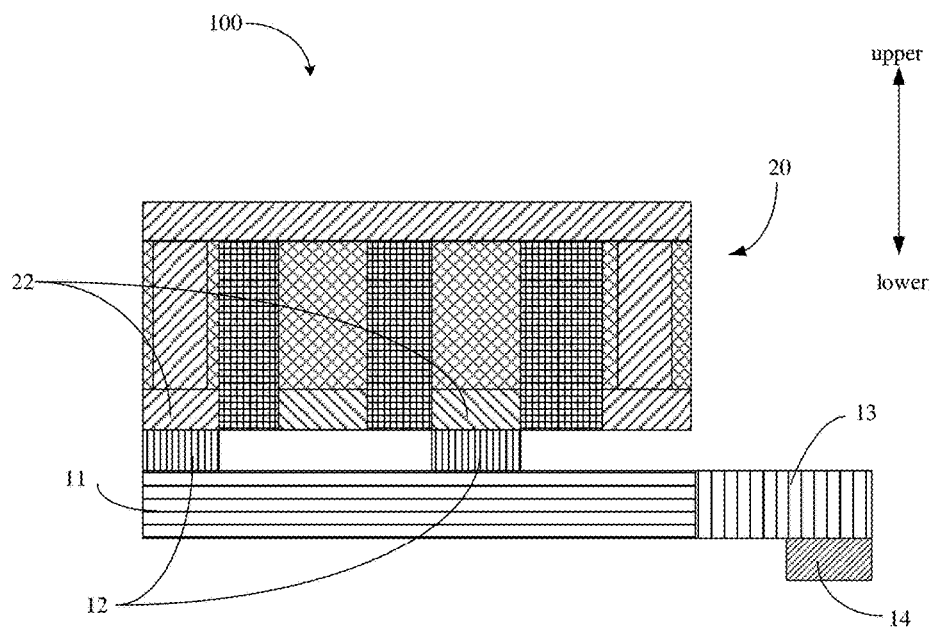
FIG. 11 is a schematic cross section view of an exemplary fingerprint sensor according to another embodiment of the present disclosure.

As shown in FIGS. 10 and 11, in some embodiments, the substrate 10 comprises a rigid-flexible circuit board, wherein the rigid-flexible circuit board comprises a rigid portion 11 and a flexible portion 13.

In some embodiments, the first connecting electrodes 12 are provided on the upper surface of the rigid portion 11.

In the embodiments, the transducer 20 is provided on the upper surface of the rigid portion 11, in other words, the ultrasonic transducer is being electrically connected to the first connecting electrodes 12 on the rigid portion 11 via the third connecting electrodes 22.

It could be understood that, the expansion of a rigid circuit board or the rigid portion 11 is smaller than a flexible board in the process of thermal treatment, such that the connecting electrodes of the ultrasonic transducer 20 could be connected to the connecting electrodes of the substrate 10 accurately.

In detail, the first connecting electrodes 12 and the third connecting electrodes 22 may be bonded by ACF, or may be welded by a solder material such as tin, and there is no limitation thereto.

In some embodiments, the fingerprint identification module 1000 is applied to certain mobile terminals, such as mobile phones. Limited by the internal pitches, the size or the volume of the ultrasonic transducer 100 will not be desired to increase in a large extent after bonding the substrate 10, so that the size of the rigid portion 11 is preferable approximately equal to the size of the ultrasonic transducer 20.

In some embodiments, the first connecting electrodes 12 are provided in correspondence with the third connecting electrodes 22.

Such that, the influence of the size of bonding a substrate 10 to the fingerprint sensor 100 could be reduced as much as possible.

Figure 12:
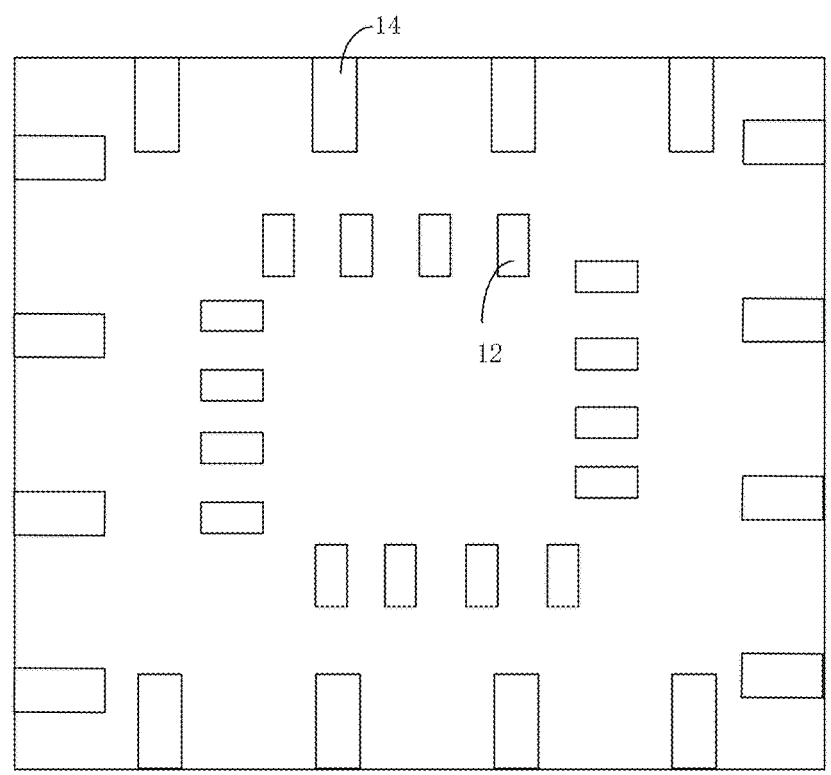
FIG. 12 is a schematic view of an exemplary arrangement of the second connecting electrodes according to an embodiment of the present disclosure.

It could be understood that the purpose of providing the substrate 10 is to overcome the fact that the ultrasonic transducer 20 cannot be directly connected to the flexible circuit board due to the difference in thermal expansion when the pitches between the connecting electrodes of the ultrasonic transducer become such small. Therefore, it is necessary to increase the original smaller pitches by providing the second connecting electrodes 14 to facilitate to bond to the flexible circuit board, As shown in FIG. 12, in some embodiments, the positive projections of second connecting electrodes 14 on the upper surface of the substrate 10 are distributed around the first connecting electrodes 12.

Such that, increasing the pitches between the connecting electrodes effectively.

Certainly, the arrangement of the second connecting electrodes 14 which increases the pitches between the connecting electrodes could be provided without limitation. For example, when the third connecting electrodes 22 are formed in four directions, the first connecting electrodes 12 are provided corresponding to the third connecting electrodes, and the second connecting electrodes 14 may be a rectangular or square pattern. For another example, when the third connecting electrodes 22 are formed in two directions, the second connecting electrodes 14 may be arranged in the same pattern with the third connecting electrodes 22, and the positive projections of the second connecting electrodes 22 is closer to the edge of the substrate 10 than the first connecting electrodes 12.

Figure 13:
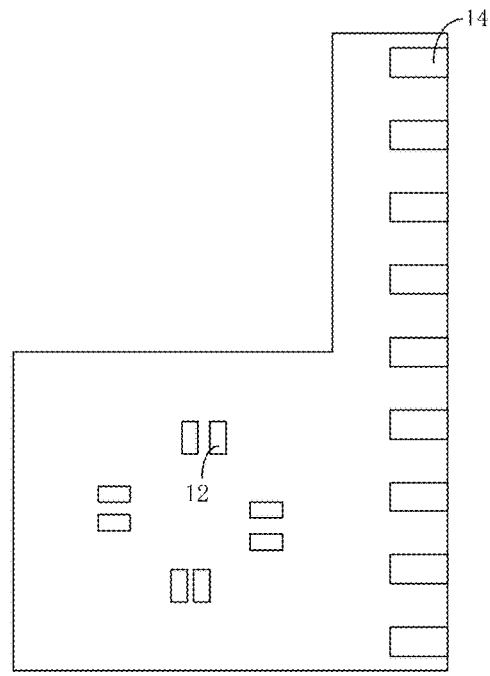
FIG. 13 is a schematic view of an exemplary arrangement of the second connecting electrodes according to another embodiment of the present disclosure.

As shown in FIG. 13, in other embodiments, when the substrate 10 is a rigid-flexible board, the second connecting electrodes 14 may provide at one side of the lower surface of the flexible portion 13.

It could be understood that, the flexible portion 13 could be bent to use a smaller pitch. Therefore, the second connecting electrodes 14 may be provided on the lower surface of the flexible portion 13. Similarly, the pitches between of the second connecting electrode 14 should be increased as much as possible within a certain size range.

Figure 14:
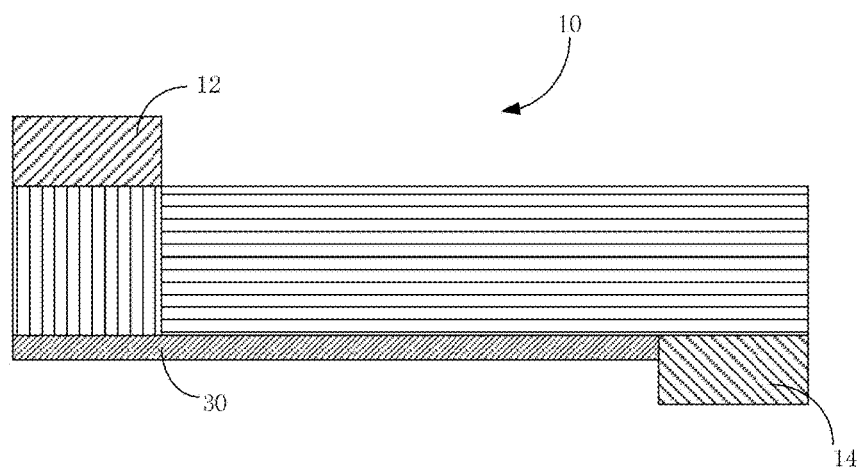
FIG. 14 is a schematic view of an exemplary structure of the bonding wires according to an embodiment of the present disclosure.

As shown in FIG. 14, further, in some embodiments, the fingerprint sensor 100 further comprises bonding wires 30.

Wherein the bonding wires 30 are configured to pass through the substrate 10 to connect the first connecting electrodes 12 with the second connecting electrodes 14.

In detail, the holes defined by passing through the substrate 10 may be formed an electroplated layer by metal. The first connecting electrodes 12 are being connected to the second connecting electrodes 14 via the bonding wires 30 on the lower surface of the substrate 10. Such that, the third connection electrodes 22 and the second electrodes 22 are electrically connected. The specific process of manufacturing for the bonding wires 30 is not limited, such as formed by the etching process.

Figure 15:
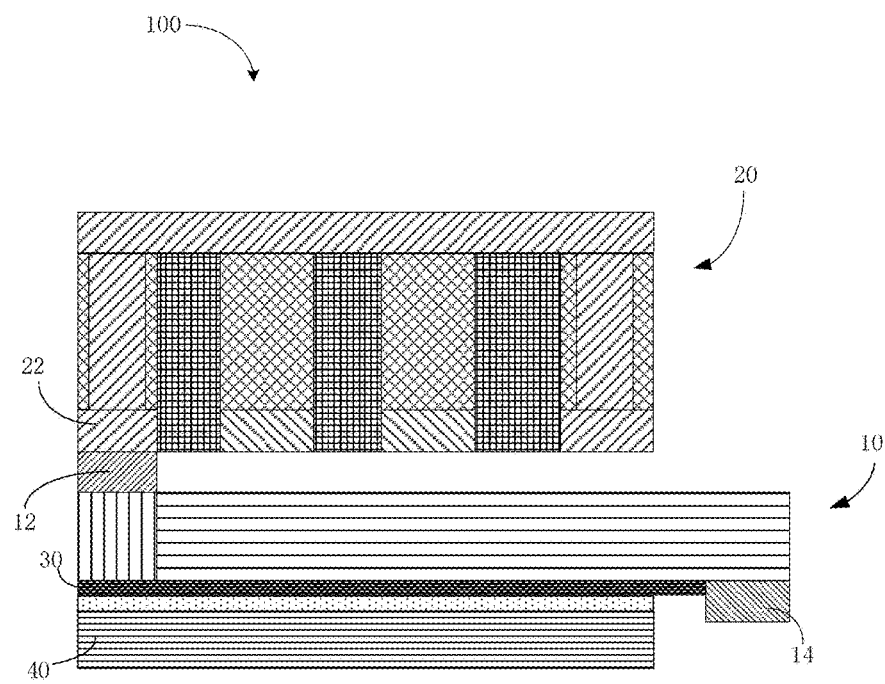
FIG. 15 is a schematic view of an exemplary structure of the reinforcing board according to an embodiment of the present disclosure.

As shown in FIG. 15, in some embodiments, the fingerprint sensor 100 further comprises a reinforcing board 40.

Wherein the reinforcing board 40 is provided on the lower surface of the substrate 10.

Such that, the ultrasonic transducer 20 and the substrate 10 could be reinforced, thereby enhancing the mechanical properties of the fingerprint sensor 100.

Further, in the embodiments, the reinforcing board is provided avoiding the seconding connecting electrodes 14.

It could be understood that, the second connecting electrodes 14 are configured to be connected to the flexible circuit board of the control chip in following process, and therefore, the reinforcing board 40 should be provided avoiding the second connecting electrodes 14.

In view of the above, a single ultrasonic transducer 100 could be manufactured by the manufacturing process which is described above. Redistributing of the third connecting electrodes 22 may be accomplished by guiding the third connecting electrodes 22 located around the piezoelectric layer 21 to be electrically connected to the second connecting electrodes 14 through the first connecting electrodes 12 of the substrate 10. It could be understood that, comparing to the fact that the third connecting electrodes 22 are being connected to the flexible circuit board directly, after redistribution, it is flexible to set the position of the second connecting electrodes 14 with bigger pitches to connect to the flexible circuit board for the situation that the pitches between the connecting electrodes is tight, so that the problem that the connecting electrodes are difficult to bonded to the flexible circuit aboard accurately due to small pitches therebetween can be improved effectively.

In this present disclosure, unless indicated otherwise, a structure in which a first feature is "on" or "underneath" a second feature may include an embodiment in which the first feature directly contacts the second feature and may include an embodiment in which an additional feature is prepared between the first feature and the second feature so that the first feature does not directly contact the second feature. Furthermore, a structure in which a first feature is "on" or "above" a second feature may include an embodiment in which the first feature is right above or inclined above the second feature and may include an embodiment in which the first feature is higher than the second feature. A structure in which a first feature is "under" or "below" a second feature may include an embodiment in which the first feature is right under or inclined under the second feature and may include an embodiment in which the first feature is lower than the second feature.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics could be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications could be made in the embodiments without departing from scope of the present disclosure.

What is claimed is:

1. A fingerprint sensor, comprising:
   a substrate comprising an upper surface, a plurality of first connecting electrodes formed on the upper surface, a lower surface, and a plurality of second connecting electrodes formed on the lower surface, and wherein the first connecting electrodes are configured to electrically connect with the second electrodes; and
   an ultrasonic transducer, wherein the ultrasonic transducer is provided on the upper surface, wherein the ultrasonic transducer comprises a plurality of third connecting electrodes, and wherein the third connecting electrodes are configured to electrically connect with the first connecting electrodes;
   wherein the substrate comprises a rigid-flexible circuit board, wherein the rigid-flexible circuit board comprises a rigid portion and a flexible portion connected with the rigid portion, wherein the rigid portion and the flexible portion are coplanar and integrally molded, wherein the ultrasonic transducer is provided on the rigid portion; and
   wherein the second connecting electrodes are provided on the lower surface of the flexible portion.

2. The fingerprint sensor of claim 1, wherein the first connecting electrodes are arranged corresponding to the third connecting electrodes.

3. The fingerprint sensor of claim 1, wherein positive projections of the second connecting electrodes on the upper surface of the substrate are distributed around the first connecting electrodes.

4. The fingerprint sensor of claim 1, wherein the ultrasonic transducer comprises:
   a piezoelectric layer, wherein the piezoelectric layer comprises an array of piezoelectric pillars;
   a plurality of receiving electrode lines being formed on the piezoelectric layer, each of the receiving electrode lines is configured to connect to a corresponding column of the piezoelectric pillars and one end of a receiving electrode line functions as one of the third connecting electrodes; and
   a plurality of emitting electrode lines being formed beneath the piezoelectric layer, each of the emitting electrode lines is configured to connected to a corresponding row of the piezoelectric pillars and one end of an emitting electrode line functions as one of the third connecting electrodes.

5. The fingerprint sensor of claim 1, wherein the fingerprint sensor further comprises bonding wires, wherein the bonding wires are configured to pass through the substrate to connect the first connecting electrodes with the second connecting electrodes.

6. The fingerprint sensor of claim 1, wherein fingerprint sensor further comprises: a reinforcing board provided on the lower surface of the substrate.

7. The fingerprint sensor of claim 6, wherein the reinforcing board is provided avoiding to cover the second connecting electrodes.

8. The fingerprint sensor of claim 4, wherein the piezoelectric layer further comprises fillers, wherein the fillers are configured to fill gaps formed between the plurality of the piezoelectric pillars.

9. The fingerprint sensor of claim 8, wherein the fillers comprise epoxy glues.

10. The fingerprint sensor of claim 4, wherein each of the piezoelectric pillars has a rectangular cross-section with a width of about 30 microns and a height of about 70-80 microns.

11. The fingerprint sensor of claim 4, wherein the thickness of the receiving electrode lines is about 2.5 microns and/or the thickness of the emitting electrode lines is about 2.5 microns.

12. The fingerprint sensor of claim 4, wherein the ultrasonic transducer further comprises: an upper protective layer, wherein the upper protective layer is configured to cover the piezoelectric layer and the receiving electrode lines; and a lower protective layer, wherein the lower protective is configured to cover the emitting electrode lines.

13. The fingerprint sensor of claim 3, wherein the positive projections of the second connecting electrodes are closer to the edge of the substrate 10 than the first connecting electrodes 12.

14. The fingerprint sensor of claim 3, wherein the positive projections of the second connecting electrodes are arranged surround the first connecting electrodes.

15. The fingerprint sensor of claim 1, wherein pitches between the second connecting electrodes are bigger than pitches between the first connecting electrodes.

16. A fingerprint identification module comprising a fingerprint sensor of claim 1.

17. The fingerprint identification module of claim 16, wherein the fingerprint identification module is an ultrasonic fingerprint identification module.

18. The fingerprint identification module of claim 16, wherein the fingerprint identification module is being applied on a mobile terminal.

* * * * *